United States Patent
Hong

(10) Patent No.: US 9,780,650 B2
(45) Date of Patent: Oct. 3, 2017

(54) CURRENT COMPENSATION CIRCUIT AND LIGHT APPARATUS COMPRISING THE SAME

(71) Applicant: Magnachip Semiconductor, Ltd., Cheongju-si (KR)

(72) Inventor: Seung Woo Hong, Seoul (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 96 days.

(21) Appl. No.: 15/067,701

(22) Filed: Mar. 11, 2016

(65) Prior Publication Data

US 2016/0285365 A1  Sep. 29, 2016

(30) Foreign Application Priority Data

Mar. 27, 2015  (KR) .................. 10-2015-0043595

(51) Int. Cl.
*H02M 3/156* (2006.01)
*H02M 1/08* (2006.01)
*H03K 17/14* (2006.01)
*H05B 33/08* (2006.01)
*H02M 1/00* (2006.01)

(52) U.S. Cl.
CPC ............ *H02M 3/156* (2013.01); *H02M 1/08* (2013.01); *H03K 17/145* (2013.01); *H05B 33/0818* (2013.01); *H02M 2001/0022* (2013.01); *H03K 2217/0027* (2013.01)

(58) Field of Classification Search
CPC .................. H02M 3/156; H05B 33/0815; H05B 33/0818
See application file for complete search history.

(56) References Cited

U.S. PATENT DOCUMENTS

| | | | |
|---|---|---|---|
| 8,941,328 B2* | 1/2015 | Wu | H05B 33/0812 315/297 |
| 2008/0259655 A1* | 10/2008 | Wei | H02M 3/335 363/21.18 |
| 2013/0154493 A1* | 6/2013 | Liang | H05B 33/0815 315/201 |

* cited by examiner

*Primary Examiner* — Thai Pham
*Assistant Examiner* — Pedro C Fernandez
(74) *Attorney, Agent, or Firm* — NSIP Law

(57) ABSTRACT

A current compensation circuit includes a current compensator configured to measure a compensation time in which a sensing voltage generated by a driving current passing through a driving switching element drops below a first certain voltage in response to the driving switching element being turned on and configured to delay a turn-off point of the driving switching element from a point in which the sensing voltage reaches a second certain voltage during the measured compensation time and a switching controller configured to provide a switching control signal at a turn-off point of the delayed driving switching element. Such a current compensation circuit accurately controls an average driving current regardless of change of an input voltage and an output voltage and is able to use a peak current mode control method to operate a light emitting diode.

20 Claims, 4 Drawing Sheets

CURRENT COMPENSATION CIRCUIT AND LIGHT APPARATUS COMPRISING THE SAME

CROSS-REFERENCE TO RELATED APPLICATION(S)

This application claims the benefit under 35 USC 119(a) of Korean Patent Application No. 10-2015-0043595, filed on Mar. 27, 2015, in the Korean Intellectual Property Office, the entire disclosure of which is incorporated herein by reference for all purposes.

BACKGROUND

1. Field

The following description relates to a driving method of a current compensation circuit. The following description also relates to the current compensation circuit and light apparatus having such a current compensation circuit so as to accurately control an average driving current regardless of changes of an input voltage and an output voltage.

2. Description of Related Art

An LED (Light Emitting Diode) light apparatus may be driven through a switching converter method and a switching converter may be classified according to a Buck-type, a Boost-type and a Buck-Boost-type. A Buck-type converter is a voltage step down and current step up converter. A Boost-type converter is a DC-to-DC power converter with an output voltage greater than its input voltage. A Buck-Boost type converter is a type of DC-to-DC converter that has an output voltage magnitude that is either greater or less than the input voltage magnitude. Previously, a switching converter of the Boost-type was used the most, but recently the Buck-type is used more often for cost reduction of an integrated circuit (IC). A type of a switching converter may be classified according to a ratio of an input voltage and an output voltage and may include a Metal-Oxide-Semiconductor Field Effect Transistor (MOSFET) in order to employ an average inductor current mode method.

An LED light apparatus may be driven by a high efficiency light apparatus driving circuit including a MOSFET. An ideal MOSFET immediately turns on when a driving current driving an LED module reaches a zero value. However, a real MOSFET may generate a delay between a point in which a driving current reaches a zero value and an actual turn-on point. Therefore, when an LED light apparatus is driven by a real MOSFET, a minimum value of a driving current may correspond to a negative value and an average driving current may decrease compared with an ideal MOSFET.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One example proposes to control accurately an average driving current regardless of change of an input voltage and an output voltage.

One example proposes to measure a compensation time related to a turn-on delay time of a driving switching element and to delay a turn-off point of a driving switching element during measured compensation time.

One example proposes to use a peak current mode control method to operate a light emitting diode.

In one general aspect, a current compensation circuit includes a current compensator configured to measure a compensation time in which a sensing voltage generated by a driving current passing through a driving switching element drops below a first certain voltage in response to the driving switching element being turned on and configured to delay a turn-off point of the driving switching element from a point at which the sensing voltage reaches a second certain voltage during the measured compensation time, and a switching controller configured to provide a switching control signal at a turn-off point of the delayed driving switching element.

The current compensator may further include a capacitive element configured to be charged or discharged during the compensation time so as to delay the turn-off point of the driving switching element.

The current compensator may further include a compensation time measurement circuit configured to compare the sensing voltage with the first certain voltage so as to provide a first switching signal related to a charge of the capacitive element.

The current compensator may further include a turn-off delay module configured to compare the second certain voltage with the sensing voltage so as to provide a second switching signal related to discharge of the capacitive element.

The current compensation circuit may further include a saw-tooth-wave voltage initialization circuit configured to initialize a saw-tooth-wave voltage applied to both terminals of the capacitive element at the turn-off point of the driving switching element.

The saw-tooth-wave voltage initialization circuit may transmit a third certain voltage as the saw tooth wave voltage through a voltage follower at the turn-off point of the driving switching element.

The current compensator may charge a constant current into a capacitive element based on a first switching signal from a turn-on point of the driving switching element during the measured compensation time.

The current compensator may discharge the capacitive element based on a second switching signal from a point in which the sensing voltage reaches a second certain voltage during the measured compensation time.

The switching controller may include a trigger module configured to provide a trigger signal for turning on the driving switching element in response to the driving current dropping below a certain current value.

The switching controller may receive the trigger signal so as to provide a switching control signal that turns on the driving switching element.

The switching controller may include a pulse width control circuit configured to generate a pulse width control signal provided at the turn-off point of the driving switching element in order to increase a pulse width corresponding to a turn-on section of the driving switching element by as much as the compensation time.

The pulse width control circuit may compare a saw tooth wave voltage applied to both ends of the capacitive element with a third certain voltage in order to generate the pulse width control signal.

The switching controller may receive the pulse width control signal in order to provide a switching control signal that turns off the driving switching element.

In another general aspect, a light emitting diode light apparatus includes an LED (Light Emitting Diode) circuit, an inductor connected in series to the LED circuit, a driving switching element connected in series to the LED circuit and the inductor, and a current compensation circuit configured to control a turn-off point of the driving switching element based on a sensing voltage generated by a driving current that drives the LED circuit, wherein the current compensation circuit includes a current compensator configured to measure compensation time in which a sensing voltage generated by a driving current passing through a driving switching element drops below a first certain voltage in response to the driving switching element being turned on and configured to delay a turn-off point of the driving switching element from a point at which the sensing voltage reaches a second certain voltage during the measured compensation time, and a switching controller configured to provide a switching control signal at a turn-off point of the delayed driving switching element.

In another general aspect, a circuit compensator configured to measure a compensation time in which a sensing voltage generated by a driving current passing through a driving switching element drops below a first certain voltage in response to the driving switching element being turned on and configured to delay a turn-off point of the driving switching element from a point at which the sensing voltage reaches a second certain voltage during the measured compensation time includes a capacitive element configured to be charged or discharged during the compensation time so as to delay the turn-off point of the driving switching element.

The current compensator may further include a compensation time measurement circuit configured to compare the sensing voltage with the first certain voltage so as to provide a first switching signal related to a charge of the capacitive element.

The current compensator may further include a turn-off delay module configured to compare the second certain voltage with the sensing voltage so as to provide a second switching signal related to discharge of the capacitive element.

The current compensator may charge a constant current to a capacitive element based on a first switching signal from a turn-on point of the driving switching element during the compensation time.

The current compensator may discharge the capacitive element based on a second switching signal from a point in which the sensing voltage reaches a second certain voltage during the compensation time.

In another general aspect, a current compensation method includes, in response to a driving switching element turning on, sensing a driving current passing through the driving switching element, measuring a compensation time in which a sensing voltage for the driving current drops below a first certain voltage, delaying a turn-off point of the driving switching element as much as the measured compensation time, and providing a switching control signal to a delayed turn-off point of the driving switching element.

According to an example, a current compensation circuit and light apparatus having the same accurately control an average driving current regardless of change of an input voltage and an output voltage.

According to an example, a current compensation circuit and light apparatus having the same measure a compensation time related to a turn-on delay time of a driving switching element and to delay a turn-off point of a driving switching element during measured compensation time.

According to an example, a current compensation circuit and light apparatus having the same use a peak current mode control method to operate a light emitting diode.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
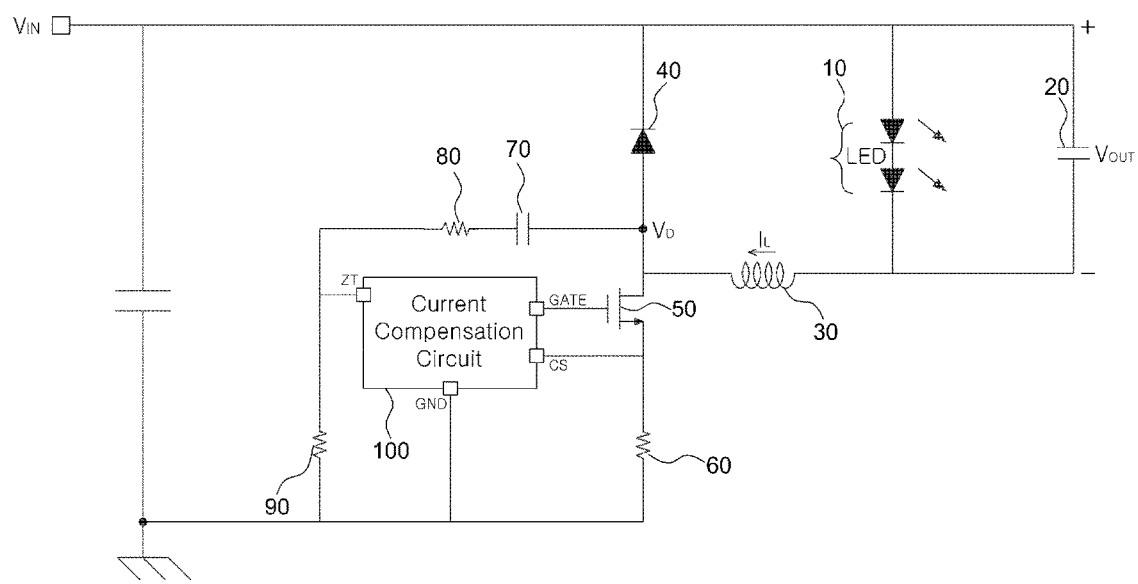
FIG. 1 is a circuit diagram illustrating a current compensation circuit and light apparatus having the same according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

While terms such as "first," "second," and the like, are used to describe various components, such components are not to be understood as being limited to the terms. The terms are merely used to help the reader to distinguish one component from another.

It is to be understood that when an element is referred to as being "connected to" or "connected with" another element, the element is possible directly connected to the other element or intervening elements are also possibly present. By contrast, when an element is referred to as being "directly connected to" another element, no intervening elements are present, except where the context makes it clear that other intervening elements are present. In addition, unless explicitly described to the contrary, the word "comprise" and variations such as "comprises" or "comprising," or synonyms such as "including" or "having," are to be understood to imply the inclusion of stated elements but not the exclusion of any other elements. Meanwhile, other expressions describing relationships between components such as "between", "immediately between" or "adjacent to" and "directly adjacent to" are to be construed similarly.

Singular forms "a", "an" and "the" in the present disclosure are intended to include the plural forms as well, unless the context clearly indicates otherwise.

Devices that are in communication with each other need not be in continuous communication with each other, unless expressly specified otherwise. In addition, devices that are in communication with each other possibly communicate directly or indirectly through one or more intermediaries.

Although process steps, method steps, algorithms, or the like, are described in a sequential order, such processes, methods and algorithms are possibly configured to work in alternate orders. In other words, any sequence or order of steps that may be described does not necessarily indicate a requirement that the steps be performed in that order. The steps of the processes, methods or algorithms described herein are possibly performed in any order practical. Further, some steps are possibly performed simultaneously.

When a single device or article is described herein, it is intended to be readily apparent that more than one device or article is possibly used in place of a single device or article. Similarly, where more than one device or article is described herein, it is intended to be readily apparent that a single device or article is possibly used in place of the more than one device or article. The functionality or the features of a device is possibly alternatively embodied by one or more other devices that are not explicitly described as having such functionality or features.

FIG. 1 is a circuit diagram illustrating a current compensation circuit and light apparatus having the same according to an example.

Referring to the example of FIG. 1, a light emitting diode light apparatus includes an LED module 10, an output capacitor 20, an inductor 30, a diode 40, a driving switching element 50, a sensing resistor 60 and a coupling capacitor 70, a first distribution resistor 80, a second distribution resistor 90 and a current compensation circuit 100.

For example, a light emitting diode light apparatus is provided an input voltage $V_{IN}$ from an input power supply. That is, an input power supply corresponds to a source of an input voltage $V_{IN}$. In examples, an input voltage $V_{IN}$ corresponds to a DC voltage $V_{DC}$ or an AC voltage $V_{AC}$. When the input voltage $V_{IN}$ corresponds to a DC voltage $V_{DC}$, an input power supply provides a stable direct current (DC) power supply $V_{DC}$. By contrast, when an input voltage $V_{IN}$ corresponds to an AC voltage $V_{AC}$, a frequency of an alternating input voltage $V_{IN}$ possibly corresponds to, but is not necessarily limited to, a frequency of 50 Hz or 60 Hz according to an electric power provider. However, this is only an example, and other examples operate with different frequencies.

In one example, a light emitting diode light apparatus is driven by using a switching converter method. In some examples, a light emitting diode light apparatus is formed using a Buck-type converter. However, examples are not necessarily limited to a Buck-type converter, and some examples are formed using a Boost-type converter or a Buck-Boost-type converter, as discussed above.

For example, an LED module 10 is formed into n, where n is a natural number, groups as a form including a series, parallel and series-parallel connection of each of an LED to be disposed. For example, an LED module 10 is driven by receiving an input voltage $V_{IN}$.

An output capacitor 20 is connected in parallel with an LED module 10. A driving current $I_L$ drives an LED module 10 by a voltage $V_{OUT}$ applied to both terminals of the output capacitor 20. A driving current $I_L$ drives the LED module 10, and when the driving switching element 50 is turned on, the driving current $I_L$ corresponds to a current that passes through a driving switching element 50.

In this example, an inductor 30 is connected in series with an LED module 10 and an output capacitor 20. Also, a driving switching element 50 is connected in series with an inductor 30 and a diode 40. Also, the driving switching element 50 is optionally located between an inductor 30 and a current compensation circuit 100. For example, a driving switching element 50 receives a switching control signal to turn on or turn off current flow from a current compensation circuit 100. When a driving switching element 50 is turned on, a driving current $I_L$ flows through a sensing resistance 60 and when a driving switching element 50 is turned off, a driving current $I_L$ cuts off a flow of a driving current $I_L$.

In one example, when a driving switching element 50 is turned on, a driving current $I_L$ flows through the driving switching element 50 and an inductor 30 charges a driving current $I_L$. However, when the driving switching element 50 is turned off, a current charged in an inductor 30 is discharged to flow into the LED module 10 through a diode 40. That is, while the driving switching element 50 is turned off, an inductor 30 operates a current source of a driving current $I_L$.

In one example, a driving switching element 50 is formed using a power MOSFET. When a driving switching element 50 is formed using a power MOSFET, a switching control signal transmits into a gate terminal of a power MOSFET through a GATE pin and controls a flow of a driving current $I_L$. For example, a switching control signal turns on a driving switching element 50 in case of a positive value, such as a high level or 1, and turns off a driving switching element 50 in case of a negative value, such as a low level or 0. A light emitting diode light apparatus controls an output, that is, a driving current, to control a luminance of an LED module 10.

For example, a sensing resistance 60 is electrically connected to a driving switching element 50 and a current compensation circuit 100. A voltage $V_{CS}$ applied to both terminals of a sensing resistance 60 is applied to a current compensation circuit 100 through a CS pin. That is, a sensing resistance 60 connects to a terminal of a driving switching element 50 for sensing a driving current $I_L$.

In such an example, a coupling capacitor 70 is electrically connected to an inductor 30 and a driving switching element 50. Such a coupling capacitor 70 cuts off a direct current component of a driving current $I_L$ and passes an alternating current component. In an example, when a driving switching element 50 is formed using a power MOSFET, if a driving current $I_L$ reaches a zero, a drain voltage $V_D$ of a power MOSFET rapidly decreases. A coupling capacitor 70 passes an alternating current component in order to detect a section in which a drain voltage $V_D$ decreases rapidly.

In one example, when a driving current $I_L$ reaches a zero, a current compensation circuit 100 provides a switching control signal in order to turn on a driving switching element 50. More specifically, when a driving current $I_L$ reaches a zero current, a voltage applied to both terminals of an inductor 30 is also potentially a zero voltage. However, because a time difference between a point in which a driving current $I_L$ reaches a zero current and a point in which a drain voltage $V_D$ corresponding to a voltage ($V_{IN}$-$V_{OUT}$) applied to a terminal between an inductor 30 and an LED module 10 is generated based on the zero current, a turn-on of a driving switching element 50 is potentially delayed. For example, a current compensation circuit 100 delays a turn-off point of a driving switching element 50 to accurately control an average driving current.

In this example, a first distribution resistor 80 and a second distribution resistor 90 are connected in series to a coupling capacitor 70 and a ZT pin is located between the first distribution resistor 80 and the second distribution resistor 90. In one example, the first distribution resistor 80 and the second distribution resistor 90 distribute a voltage of an alternating current component that passes through the coupling capacitor 70. For example, a voltage applied to a ZT pin is regulated through a ratio of a resistance value of the first distribution resistor 80 and the second distribution resistor 90. For example, when a ratio of a resistance value of the first distribution resistor 80 and the second distribution resistor 90 is 9:1, a voltage applied to a ZT pin potentially corresponds to a one-tenth level of an alternating current component voltage that passes through the coupling capacitor 70. Because a current compensation circuit 100 operates to have a significantly lower voltage than an input voltage $V_{IN}$ received from an input power supply, the first distribution resistor 80 and the second distribution resistor 90 are able to prevent an overload of the current compensation circuit 100.

Figure 2:
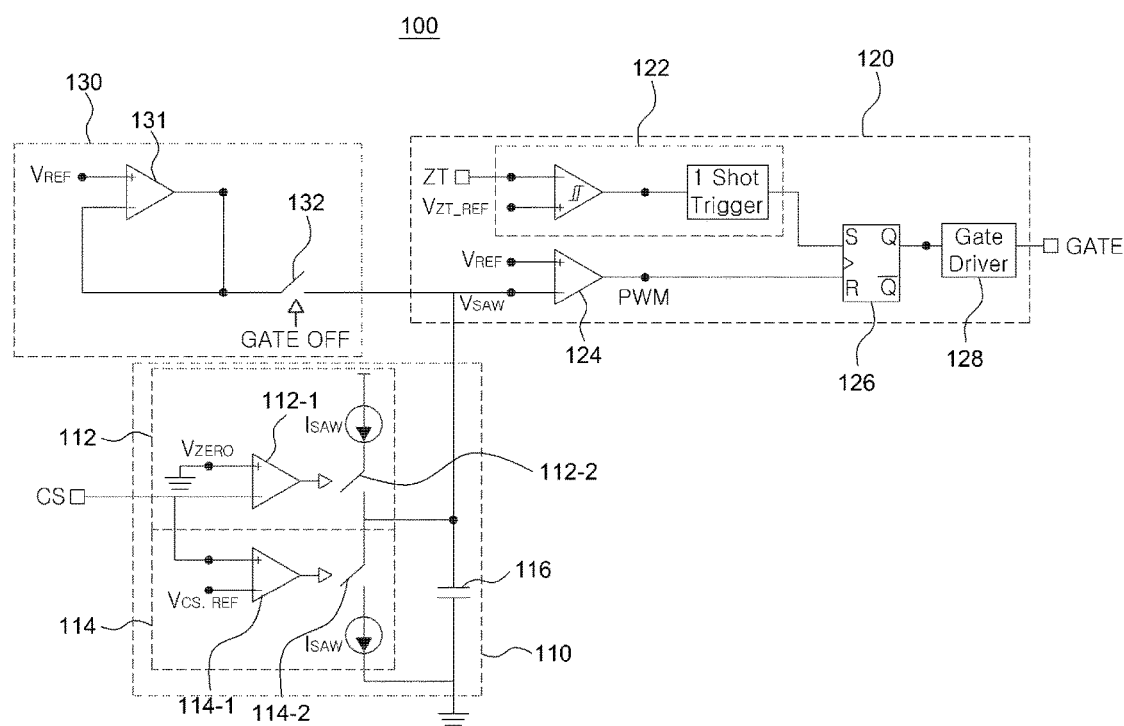
FIG. 2 is a circuit diagram illustrating a composition of a current compensation circuit in the example of FIG. 1.

FIG. 2 is a circuit diagram illustrating a composition of a current compensation circuit in the example of FIG. 1.

Referring to the example of FIG. 2, a current compensation circuit 100 includes a current compensation unit or current compensator 110, a switching control unit or switching controller 120 and a saw-tooth-wave voltage initialization unit or saw-tooth-wave voltage initialization circuit 130.

In this example, a current compensator 110 includes a compensation time measurement module 112, a turn-off delay module 114 and a capacitive element 116. For example, a current compensator 110 receives a sensing voltage $V_{CS}$ generated by a driving current $I_L$ passing through a driving switching element 50 through a CS pin. Here, in this example, the sensing voltage $V_{CS}$ is provided to a compensation time measurement module 112 and a turn-off delay module 114 through the CS pin.

For example, a compensation time measurement module 112 includes a first comparator 112-1 and a first switching element 112-2. Here, the compensation time measurement module 112 measures a compensation time in which a sensing voltage $V_{CS}$ drops below a first certain voltage. In this example, a compensation time is related to a turn-on delay time of the driving switching element 50. Also, a sensing voltage $V_{CS}$ possibly drops below a first certain voltage during a turn-on delay time of a driving switching element 50 and increases with a constant slope when a driving switching element 50 is turned on. That is, a turn-on delay time is proportional to a compensation time. In one example, the first certain voltage corresponds to a zero voltage $V_{ZERO}$.

Thus, a first comparator 112-1 compares the sensing voltage $V_{CS}$ with the first certain voltage to provide a first switching signal that is related to a charge of a capacitive element 116 to the first switching element 112-2. Accordingly, a compensation time measurement module 112 provides a constant current $I_{SAW}$ to the capacitive element 116 when the first switching element 112-2 is turned on. More specifically, a compensation time measurement module 112 charges a constant current $I_{SAW}$ to the capacitive element 116 based on a first switching signal during a compensation time measured from a turn-on point of the driving switching element 50.

A turn-off delay module 114 includes a second comparator 114-1 and a second switching element 114-2. A turn-off delay module 114 delays a turn-off point of a driving switching element 50 based on a compensation time measured from a point in which a sensing voltage $V_{CS}$ reaches a second certain voltage $V_{CS\_REF}$. In this example, a compensation time potentially corresponds to a compensation time measured in a compensation time measurement module 112. That is, a turn-off delay module 114 delays a turn-off point of a driving switching element 50 as according to a time at which a sensing voltage $V_{CS}$ reaches a first certain voltage level after the driving switching element 50 is turned on. In one example, the second certain voltage $V_{CS\_REF}$ is predetermined by a designer.

A second comparator 114-1 compares a second certain voltage $V_{CS\_REF}$ with a sensing voltage $V_{CS}$ to provide a second switching signal related to a discharge of the capacitive element 116 into a second switching element 114-2. When the second switching element 114-2 is turned on, the capacitive element 116 is discharged at a discharge rate that is equal to a charge-rate of a constant current $I_{SAW}$. More specifically, a turn-off delay module 114 discharges the capacitive element 116 starting from a point at which a sensing voltage $V_{CS}$ reaches a second certain voltage $V_{CS\_REF}$ during the compensation time period.

The capacitive element 116 is potentially charged or discharged during a compensation time to delay a turn-off point of a driving switching element 50. In one example, a capacitive element 116 is formed as a capacitor. Such a capacitive element 116 is potentially charged by a constant current $I_{SAW}$ when a first switching element 112-2 is turned on and is potentially discharged, in such an example, with a discharge-rate that is equal to a charge rate when a second switching element 114-2 is turned on. A saw-tooth-wave voltage $V_{SAW}$ corresponds to a voltage applied to both terminals of the capacitive element 116. Accordingly, a saw-tooth-wave voltage $V_{SAW}$ increases in proportion to a charge rate of the capacitive element 116 and decreases in proportion to a discharge rate.

In the example of FIG. 2, the switching controller 120 includes a trigger module 122, a pulse width control module 124, a storage element 126 and a gate driver 128. The switching controller 120 provides a switching control signal to a driving switching element 50 through a gate pin at a turn-off point of a driving switching element 50.

For example, the trigger module 122 compares a voltage $V_{ZT}$ applied through a ZT pin with a fourth certain voltage value $V_{ZT\_REF}$. When a driving current $I_L$ drops below a certain current value, a trigger module 122 provide a trigger signal in order to turn on a driving switching element 50. In one example, the certain current value corresponds to a zero current. Thus, when the driving current $I_L$ drops below a certain current, a drain voltage $V_D$ of a driving switching element 50 decreases and accordingly a coupling capacitor 70 passes an alternating current component of a driving current. Hence, a trigger module 122 provides a trigger signal when a voltage $V_{ZT}$ applied through a ZT pin reaches a fourth certain voltage $V_{ZT\_REF}$ and a trigger signal corresponds to an edge clock.

In this example, a pulse width control module 124 compares a saw-tooth-wave voltage $V_{SAW}$ applied to both terminals of a capacitive element 116 with a third certain voltage $V_{REF}$ to generate a pulse width control signal. More specifically, in this example, a pulse width control module 124 generates a pulse width control signal provided at a turn-off point of a driving switching element 50 in order to increase a pulse width that corresponds to a turn-on section of a driving switching element 50 as according to a compensation time. For example, a pulse width control module 124 provides a pulse width control signal to a storage element 126.

In this example, the storage element 126 is electrically connected to the trigger module 122 and the pulse width control module 124. Here, the storage element 126 changes an output value based on an output change point of a trigger module 122 or a pulse width control module 124.

Furthermore, a gate driver 128 receives an output value of the storage element 126 so as to output a switching control signal. A switching control signal is provided to a driving switching element 50 through a gate pin. In one example, the gate driver 128 amplifies an output of the storage element 126 up to a voltage required to a turn-on or turn-off of a driving switching element 50 and outputs a switching control signal at a low impedance. Likewise, the gate driver 128 rapidly provides a switching control signal to a driving switching element 50 based on a change of an output value of the storage element 126.

In one example, the storage element 126 is formed using a SR latch. Such a latch is so called as a Set/Reset latch. For example, when the storage element 126 receives a trigger signal through its S terminal from a trigger module 122, the storage element 126 may output a positive value, such as high level or 1, accordingly turning on a driving switching element 50. By contrast, when the storage element 126 receives a pulse width control signal through its R terminal from a pulse width control module 124, the storage element 126 outputs a negative value, such as low level or 0, accordingly turning off a driving switching element 50. The gate driver 128 outputs a switching control signal accordingly based on an output value of the storage element 126.

In the example of FIG. 2, a saw-tooth-wave voltage initialization circuit 130 includes a third comparator 131 and a third switching element 132. For example, the saw-tooth-wave voltage initialization circuit 130 initializes a saw-tooth-wave voltage $V_{SAW}$ applied to both terminals of a capacitive element 126 at a turn-off point of a driving switching element 50. In one example, a third comparator 131 is formed with a voltage follower. In such an example, the third comparator 131 receives a third certain voltage $V_{REF}$ to transmit through an output terminal. In such an example, the third switching element 132 is turned on when the driving switching element 50 is turned off and a saw-tooth-wave voltage initialization circuit 130 transmits the third certain voltage $V_{REF}$ into a saw-tooth-wave voltage $V_{SAW}$. Therefore, a saw-tooth-wave voltage $V_{SAW}$ is initialized whenever the driving switching element 50 is turned off.

Figure 3:
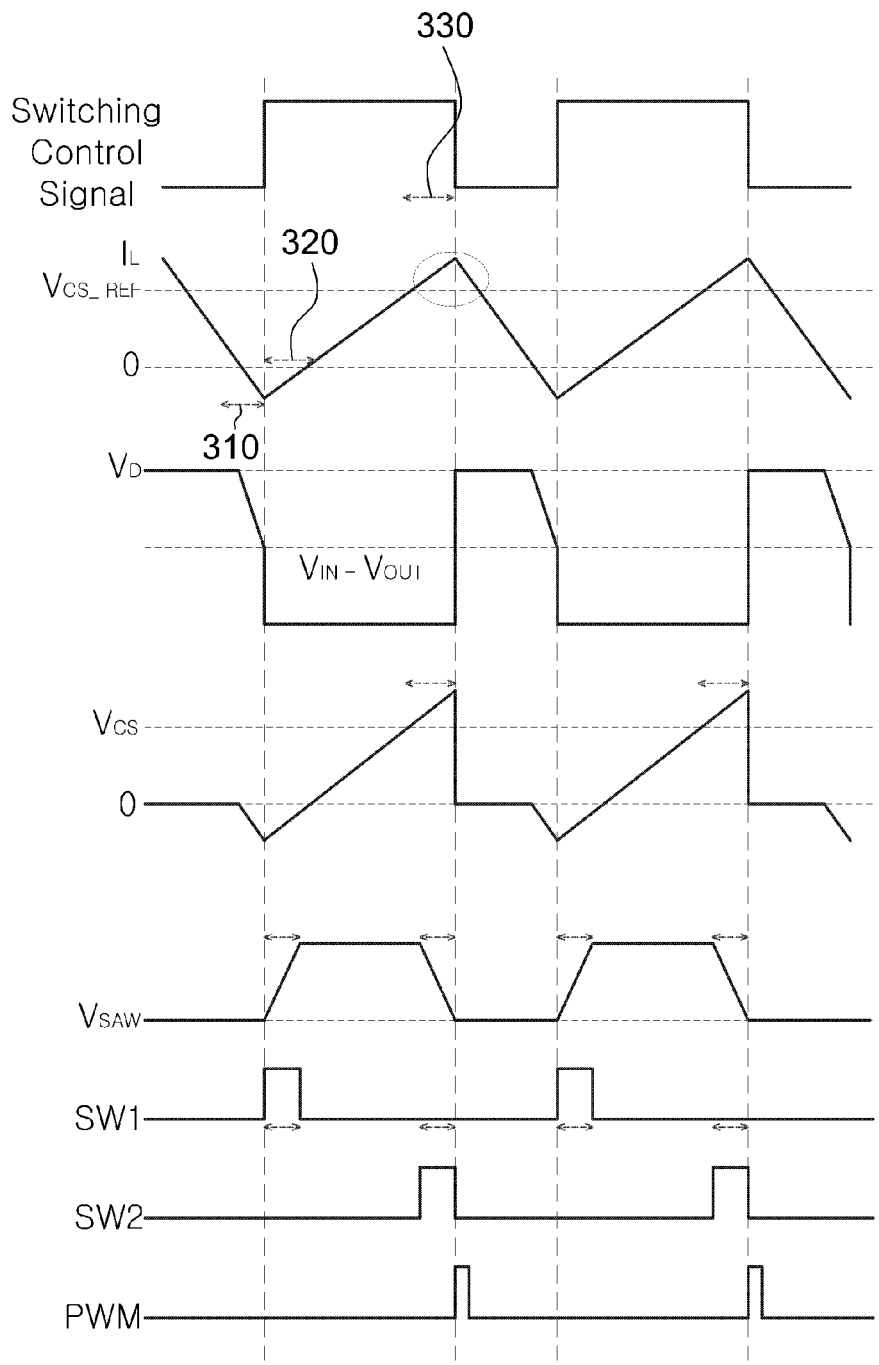
FIG. 3 is a waveform diagram illustrating an operating of a current compensation circuit and light apparatus having the same in the example of FIG. 1.

FIG. 3 is a waveform diagram illustrating an operation of a current compensation circuit and light apparatus having the same in the example of FIG. 1.

When the driving switching element 50 is turned on, a driving current $I_L$ flows through the driving switching element 50 and increases with a constant slope. In one example, an increase slope of the driving current $I_L$ is proportional to a voltage applied to a terminal between an inductor 30 and an LED module 10 and is inversely proportional to an inductance L of the inductor 30. In the example of FIG. 1, a voltage of $[V_{IN}-V_{OUT}]$ is applied between the inductor 30 and the LED module 10. That is, in such an example, an increase slope of the driving current $I_L$ corresponds to $[(V_{IN}-V_{OUT})/L]$, where L is an inductance.

However, a driving current $I_L$ potentially flows into an LED module 10 through a diode 40 when the driving switching element 50 is turned off. When the driving switching element 50 is turned off, a current charged in the inductor 30 is discharged. As a result, a driving current $I_L$ decreases with a constant slope. In one example, a decrease slope of a driving current $I_L$ is proportional to a voltage applied to both terminals of the LED module 10 and is inversely proportional to an inductance of the inductor 30. In the example of FIG. 1, a voltage of $[V_{OUT}]$ is applied to both terminals of the LED module 10. That is, a decrease slope of a driving current $I_L$ corresponds to $[-V_{OUT}/L]$, where L is an inductance.

In one example, if a driving current $I_L$ drops below a certain current, a drain voltage $V_D$ of the driving switching element 50 decreases. In such an example, the certain current potentially corresponds to a zero current. While a drain voltage $V_D$ of a driving switching element 50 rapidly decreases, a turn-on delay time 310 of the driving switching element 50 operates. In this example, the turn-on delay time 310 of the driving switching element 50 corresponds to a time from a point in which a driving current $I_L$ reaches a zero current to a turn-on point of the driving switching element 50. Therefore, the driving current $I_L$ continuously decreases after reaching a zero current and reaches a minimum peak level at a turn-on point of the driving switching element 50.

In one example, a compensation time 320 is related to the turn-on delay time 310. In this example, the compensation time 320 corresponds to a time from a point at which a driving current $I_L$ reaches a minimum peak level to a point at which a driving current $I_L$ reaches a zero current. If the turn-on delay time 310 becomes longer, a minimum peak level decreases for the compensation time 320 to become longer. That is, in such a more specific example, the turn-on delay time 310 is proportional to the compensation time 320.

For example, a compensation time measurement module 112 measures a compensation time 320 in which a sensing voltage $V_{CS}$ drops below a first certain voltage. In one such example, the first certain voltage corresponds to a zero voltage $V_{ZERO}$. A first comparator 112-1 compares a sensing voltage $V_{CS}$ with the first certain voltage $V_{ZERO}$ to provide a first switching signal SW1 related to a charge of a capacitive element into a first switching element 112-2. For example, the first switching signal SW1 corresponds to a positive value, such as a high level or 1, during a compensation time 320. For example, a compensation time measurement module 112 provides a constant current $I_{SAW}$ to a capacitive element 116 when the first switching element 112-2 is turned on. Hence, when the first switching element 112-2 is turned on, the capacitive element 116 is charged with a constant current $I_{SAW}$ and a saw-tooth-wave voltage for measuring a compensation time continuously increases during a compensation time 320.

In this example, a turn-off delay module 114 delays a turn-off point of the driving switching element 50 from a point in which a sensing voltage $V_{CS}$ reaches a second certain voltage $V_{CS\_REF}$ during the compensation time 320. In such an example, a compensation time 330 is potentially identical to a compensation time 320 measured by the compensation time measurement module 112. Also, a second comparator 114-1 compares a second certain voltage $V_{CS\_REF}$ with a sensing voltage $V_{CS}$ so as to provide a second switching signal SW2 that is related to a discharge of a capacitive element 116 into a second switching element 114-2. For example, the second switching signal SW2 corresponds to a positive value, such as a high level or 1, from a point in which a sensing voltage $V_{CS}$ reaches the second certain voltage $V_{CS\_REF}$ during the compensation time 330. When the second switching element 114-2 is turned on, a capacitive element 116 is discharged with a discharge-rate that is equal to a charge rate corresponding to a same current level to a constant current $I_{SAW}$ that charges a saw-tooth-wave voltage $V_{SAW}$. An absolute value of a decreasing slope of a saw-tooth-wave voltage $V_{SAW}$ is proportional to an absolute value of an increasing slope.

Here, a pulse width control module 124 compares the saw-tooth-wave voltage $V_{SAW}$ that is applied to both terminals of a capacitive element 116 with a third certain voltage $V_{REF}$ so as to generate a pulse width control signal PWM. That is, a capacitive element 116 is discharged from a point at which a sensing voltage $V_{CS}$ reaches the second certain voltage $V_{CS\_REF}$ so as to decrease the saw-tooth-wave voltage $V_{SAW}$ and when the saw-tooth-wave voltage $V_{SAW}$ reaches the third certain voltage $V_{REF}$, a pulse width control module 124 outputs a pulse width control signal PWM. For example, the pulse width control module 124 generates a pulse width control signal PWM in order to increase a pulse width of a switching control signal as much as a compensation time 330 to provide the PWM signal to a storage element 126.

Figure 4:
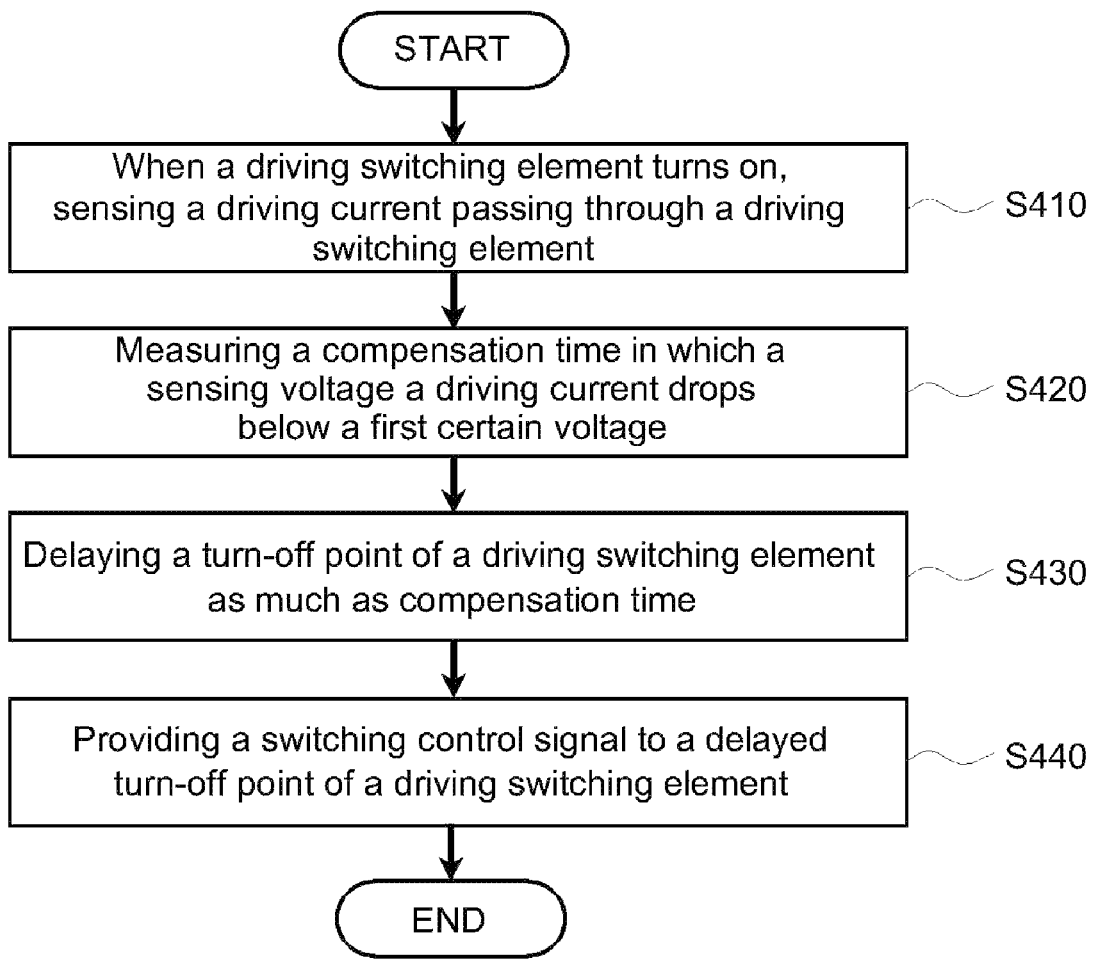
FIG. 4 is a flow chart diagram illustrating a driving method of a current compensation circuit and light apparatus having the same in the example of FIG. 1.

FIG. 4 is a flow chart diagram illustrating a driving method of a current compensation circuit and light apparatus having the same in the example of FIG. 1.

For example, in step S410, a current compensator 110 senses a driving current passing through a driving switching element 50 when the driving switching element 50 is turned on. More specifically, in an example, a sensing resistance 60 is connected to the terminal of a driving switching element 50 and receives a sensing voltage $V_{CS}$ applied to both terminals of the sensing resistance 60 through a CS pin.

In step S420, the current compensator 110 measures a compensation time 320 in which a sensing voltage $V_{CS}$ drops below a first certain voltage. More specifically, the compensation time 320 corresponds to a time from a point at which a driving current $I_L$ reaches a minimum peak level to a point at which the driving current $I_L$ reaches a zero current. When a driving switching element 50 is turned on, a current compensator 110 compares the sensing voltage $V_{CS}$ with a first certain voltage $V_{ZERO}$ to measure the compensation time 320.

In step S430, the current compensator 110 delays a turn-off point of a driving switching element 50 as a compensation time 330. More specifically, the current compensator 110 discharges a capacitive element 116 from a point at which a sensing voltage reaches a second certain voltage $V_{CS\_REF}$ and when a saw-tooth-wave voltage $V_{SAW}$ reaches a third certain voltage $V_{REF}$, and accordingly a switching controller 120 provides a pulse width control signal PWM for turning off the driving switching element 50.

In step S440, the switching controller 120 provides a switching control signal at a turn-off point delayed for the driving switching element 50. More specifically, a storage element 116 receives the pulse width control signal PWM so as to output a negative value, such as low level or 0, thereby turning off a driving switching element 50. Accordingly a gate driver 128 outputs a switching control signal based on the output value.

Therefore, the current compensation circuit 100 and a lighting apparatus having the same are able to prevent a decrease of an average driving current caused by a turn-on delay time of a driving switching element. For example, such a current compensation circuit 100 is able to accurately control an average driving current regardless of change of an input voltage and an output voltage. Such a current compensation circuit 100 potentially uses a peak current mode control method to operate a light emitting diode. Also, the current compensation circuit 100 potentially measures a compensation time corresponding to a turn-on time of a driving switching element and accordingly delays a turn-off point of a driving switching element as much as a measured compensation time.

The apparatuses, units, modules, devices, compensators, circuits, and other components illustrated in FIGS. 1-4 that perform the operations described herein with respect to FIGS. 1-4 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-4. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-4 that perform the operations described herein with respect to FIGS. 1-4 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

LISTING OF SYMBOLS

10: LED module
20: output capacitor
30: inductor
40: diode
50: driving switching element
60: sensing resistor
70: coupling capacitor
80,90: first and second distribution resistor
100: current compensation circuit
110: current compensation unit or compensator
112: compensation time measurement module
112-1: first comparator
112-2: first switching element
114: turn-off delay module
114-1: second comparator
114-2: second switching element
116: capacitive element
120: switching control unit or controller
122: trigger module
124: pulse width control module
126: storage element
128: gate driver
130: saw-tooth-wave voltage initialization unit or initialization circuit
131: third comparator
132: third switching element

What is claimed is:

1. A current compensation circuit, comprising:
a current compensator configured to measure a compensation time in which a sensing voltage generated by a driving current passing through a driving switching element drops below a first certain voltage in response to the driving switching element being turned on and configured to delay a turn-off point of the driving switching element from a point at which the sensing voltage reaches a second certain voltage during the measured compensation time; and
a switching controller configured to provide a switching control signal at a turn-off point of the delayed driving switching element.

2. The current compensation circuit of claim 1, wherein the current compensator further comprises a capacitive element configured to be charged or discharged during the compensation time so as to delay the turn-off point of the driving switching element.

3. The current compensation circuit of claim 2, wherein the current compensator further comprises a compensation time measurement circuit configured to compare the sensing voltage with the first certain voltage so as to provide a first switching signal related to a charge of the capacitive element.

4. The current compensation circuit of claim 3, wherein the current compensator further comprises a turn-off delay module configured to compare the second certain voltage with the sensing voltage so as to provide a second switching signal related to discharge of the capacitive element.

5. The current compensation circuit of claim 2, further comprising:
a saw-tooth-wave voltage initialization circuit configured to initialize a saw-tooth-wave voltage applied to both terminals of the capacitive element at the turn-off point of the driving switching element.

6. The current compensation circuit of claim 5, wherein the saw-tooth-wave voltage initialization circuit transmits a third certain voltage as the saw tooth wave voltage through a voltage follower at the turn-off point of the driving switching element.

7. The current compensation circuit of claim 1, wherein the current compensator charges a constant current into a capacitive element based on a first switching signal from a turn-on point of the driving switching element during the measured compensation time.

8. The current compensation circuit of claim 7, wherein the current compensator discharges the capacitive element based on a second switching signal from a point in which the sensing voltage reaches a second certain voltage during the measured compensation time.

9. The current compensation circuit of claim 1, wherein the switching controller comprises a trigger module configured to provide a trigger signal for turning on the driving switching element in response to the driving current dropping below a certain current value.

10. The current compensation circuit of claim 9, wherein the switching controller receives the trigger signal so as to provide a switching control signal that turns on the driving switching element.

11. The current compensation circuit of claim 1, wherein the switching controller comprises a pulse width control circuit configured to generate a pulse width control signal provided at the turn-off point of the driving switching element in order to increase a pulse width corresponding to a turn-on section of the driving switching element by as much as the compensation time.

12. The current compensation circuit of claim 11, wherein the pulse width control circuit compares a saw tooth wave voltage applied to both ends of the capacitive element with a third certain voltage in order to generate the pulse width control signal.

13. The current compensation circuit of claim 11, wherein the switching controller receives the pulse width control signal in order to provide a switching control signal that turns off the driving switching element.

14. A light emitting diode light apparatus, comprising:
an LED (Light Emitting Diode) circuit;
an inductor connected in series to the LED circuit;
a driving switching element connected in series to the LED circuit and the inductor; and
a current compensation circuit configured to control a turn-off point of the driving switching element based on a sensing voltage generated by a driving current that drives the LED circuit,
wherein the current compensation circuit comprises:
a current compensator configured to measure a compensation time in which a sensing voltage generated by a driving current passing through a driving switching element drops below a first certain voltage in response to the driving switching element being turned on and configured to delay a turn-off point of the driving switching element from a point at which the sensing voltage reaches a second certain voltage during the measured compensation time; and
a switching controller configured to provide a switching control signal at a turn-off point of the delayed driving switching element.

15. A circuit compensator configured to measure a compensation time in which a sensing voltage generated by a driving current passing through a driving switching element drops below a first certain voltage in response to the driving switching element being turned on and configured to delay a turn-off point of the driving switching element from a point at which the sensing voltage reaches a second certain voltage during the measured compensation time, comprising:
a capacitive element configured to be charged or discharged during the compensation time so as to delay the turn-off point of the driving switching element.

16. The current compensator of claim 15, wherein the current compensator further comprises a compensation time measurement circuit configured to compare the sensing voltage with the first certain voltage so as to provide a first switching signal related to a charge of the capacitive element.

17. The current compensator of claim 16, wherein the current compensator further comprises a turn-off delay module configured to compare the second certain voltage with the sensing voltage so as to provide a second switching signal related to discharge of the capacitive element.

18. The current compensator of claim 15, wherein the current compensator charges a constant current to a capacitive element based on a first switching signal from a turn-on point of the driving switching element during the compensation time.

19. The current compensator of claim 18, wherein the current compensator discharges the capacitive element based on a second switching signal from a point in which the sensing voltage reaches a second certain voltage during the compensation time.

20. A current compensation method, comprising:
in response to a driving switching element turning on, sensing a driving current passing through the driving switching element;
measuring a compensation time in which a sensing voltage for the driving current drops below a first certain voltage;
delaying a turn-off point of the driving switching element as much as the measured compensation time; and
providing a switching control signal to a delayed turn-off point of the driving switching element.

* * * * *